United States Patent [19]

Lin

[11] Patent Number: 5,762,505
[45] Date of Patent: Jun. 9, 1998

[54] ALIGNMENT DEVICE FOR USE WITH A SOCKET CONNECTOR

[75] Inventor: Cheng-Hung Lin, Chung-Ho, Taiwan

[73] Assignee: Hon Hai Precision Ind. Co., Ltd., Taiwan, Taiwan

[21] Appl. No.: 759,053

[22] Filed: Dec. 2, 1996

[51] Int. Cl.[6] ............................................. H01R 9/09
[52] U.S. Cl. .................................... 439/83; 439/71
[58] Field of Search .......................... 439/83, 876, 74, 439/71

[56] References Cited

U.S. PATENT DOCUMENTS

| | | |
|---|---|---|
| 4,052,118 | 10/1977 | Scheingold et al. ............. 439/71 |
| 5,203,710 | 4/1993 | Miyazawa ........................ 439/83 |

Primary Examiner—Gary F. Paumen
Assistant Examiner—T. C. Patel

[57] ABSTRACT

A socket connector (10) includes an housing (12) including a pair of side walls (14) and a pair of end walls (16) commonly defining a cavity (18) for receiving a chip carrier therein. A plurality of passageways (20) are disposed in two side walls (14) of the housing (12) for receiving a corresponding number of contacts (22) therein. A bottom surface (36) is provided with the housing (12) for supportably receiving the chip carrier in the cavity. A plurality of openings (38) are provided in the bottom surface (36) along two opposite sides thereof wherein each opening (38) corresponds to every two adjacent passageways (20). A dividing bar (40) of the bottom surface (36) is provided between every two adjacent openings (38). A pair of shortened abutment wings (42) extend laterally by two sides of the dividing bar (40) and on the under-surface (44) of the bottom surface (36) whereby the surface-mounting contact tails (34) of two adjacent contacts (22) by two sides of every dividing bar (40) can be engageably aligned with the corresponding abutment wings (42), respectively, for maintaining the contact tails (34) in the same plane.

2 Claims, 2 Drawing Sheets

ALIGNMENT DEVICE FOR USE WITH A SOCKET CONNECTOR

BACKGROUND OF THE INVENTION

1. Field of The Invention

The invention relates to the socket connector for use with a chip carrier, and particularly to the socket connector having an alignment device along its under-surface for preventing upward movement of the respective contact tails.

2. The Relates Art

U.S. Pat. Nos. 4,934,944, 5,055,972 and 5,177,671 disclose chip carrier socket defining openings in the bottom plate thereof to expose the surface-mounting contact tails for easy access and inspection. The disadvantage of this through opening type socket is that each of the respective surface-mounting contact tails lack proper abutment means to maintain itself in a true horizontal position for coplanar compliance with the corresponding circuit pads on the PC board on which the socket is mounted.

An object of the invention is to provide an auxiliary abutment device located on the under-surface of the socket, which is not only to align the contact tails in the same plane, but also to allow easy access or inspection of the contact tails under the bottom surface of the socket.

SUMMARY OF THE INVENTION

According to an aspect of the invention, a socket connector includes an housing including a pair of side walls and a pair of end walls commonly defining a cavity for receiving a chip carrier therein. A plurality of passageways are disposed in two side walls of the housing for receiving a corresponding number of contacts therein. A bottom surface is provided with the housing for supportably receiving the chip carrier in the cavity. A plurality of openings are provided in the bottom surface along two opposite sides thereof wherein each opening corresponds to every two adjacent passageways. A dividing bar of the bottom surface is provided between every two adjacent openings. A pair of shortened abutment wings extend laterally by two sides of the dividing bar and on the under-surface of the bottom surface whereby the surface-mounting contact tails of two adjacent contacts by two sides of every dividing bar can be engageably aligned with the corresponding abutment wings, respectively, for maintaining the contact tails in the same plane.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
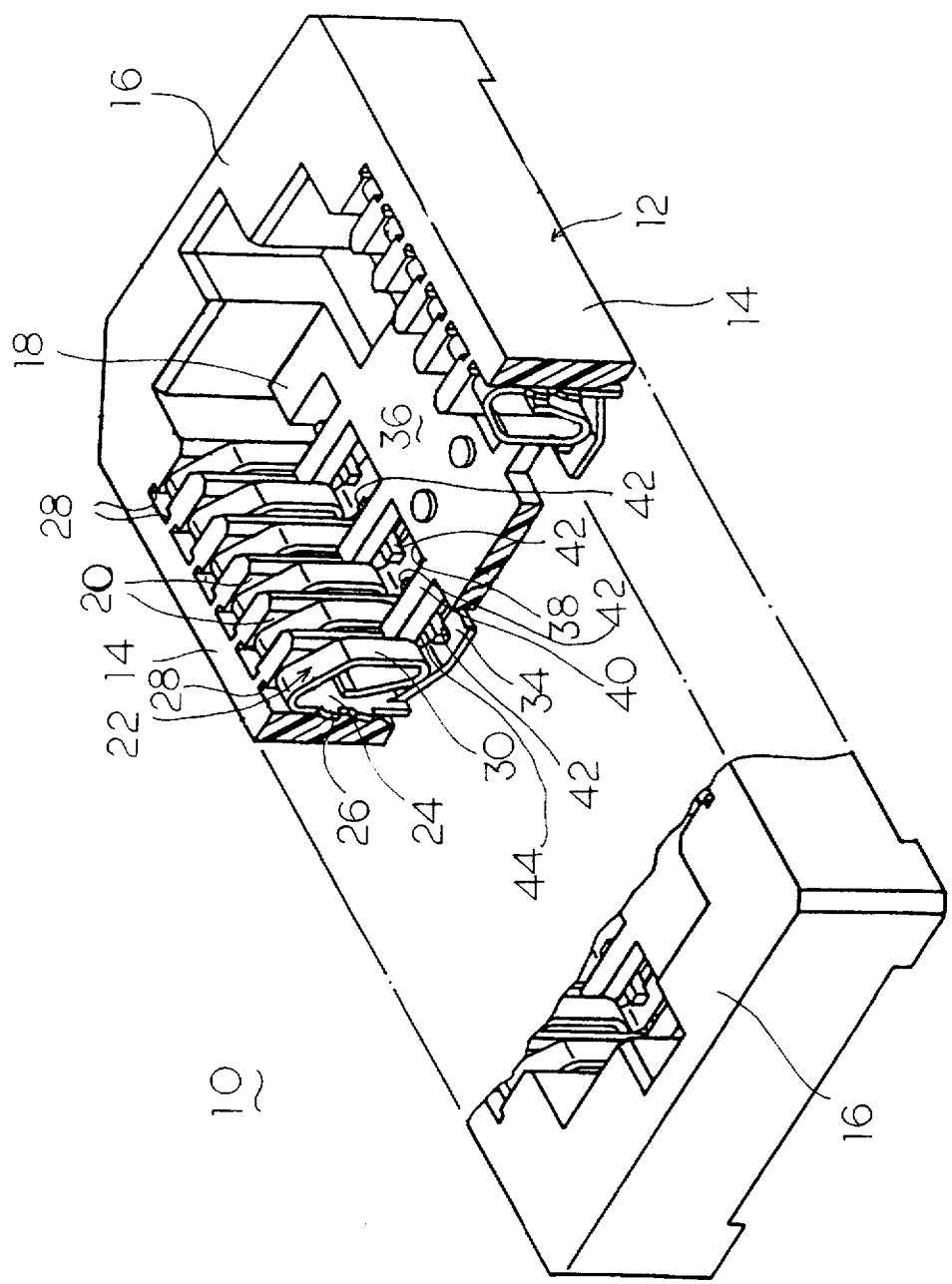
FIG. 1 is a partially cut-away perspective view of a presently preferred embodiment of a socket connector, according to the invention.
Figure 2:
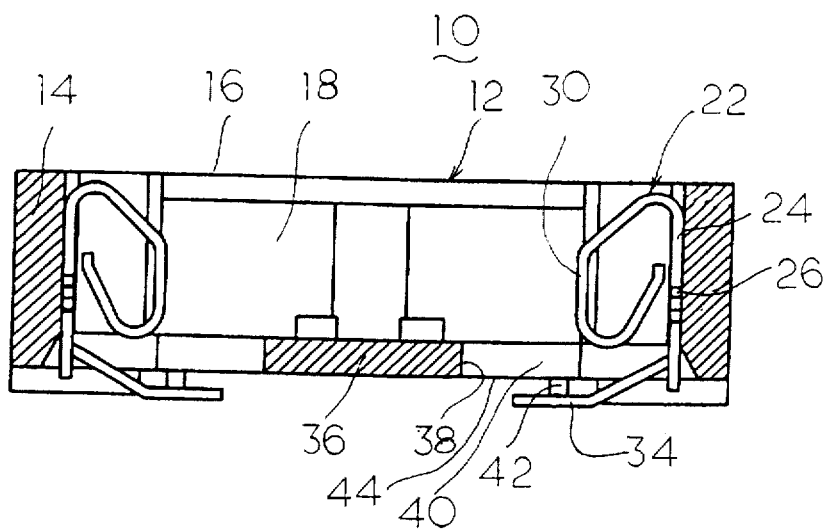
FIG. 2 is a cross-sectional view of the socket connector of FIG. 1.
Figure 3:
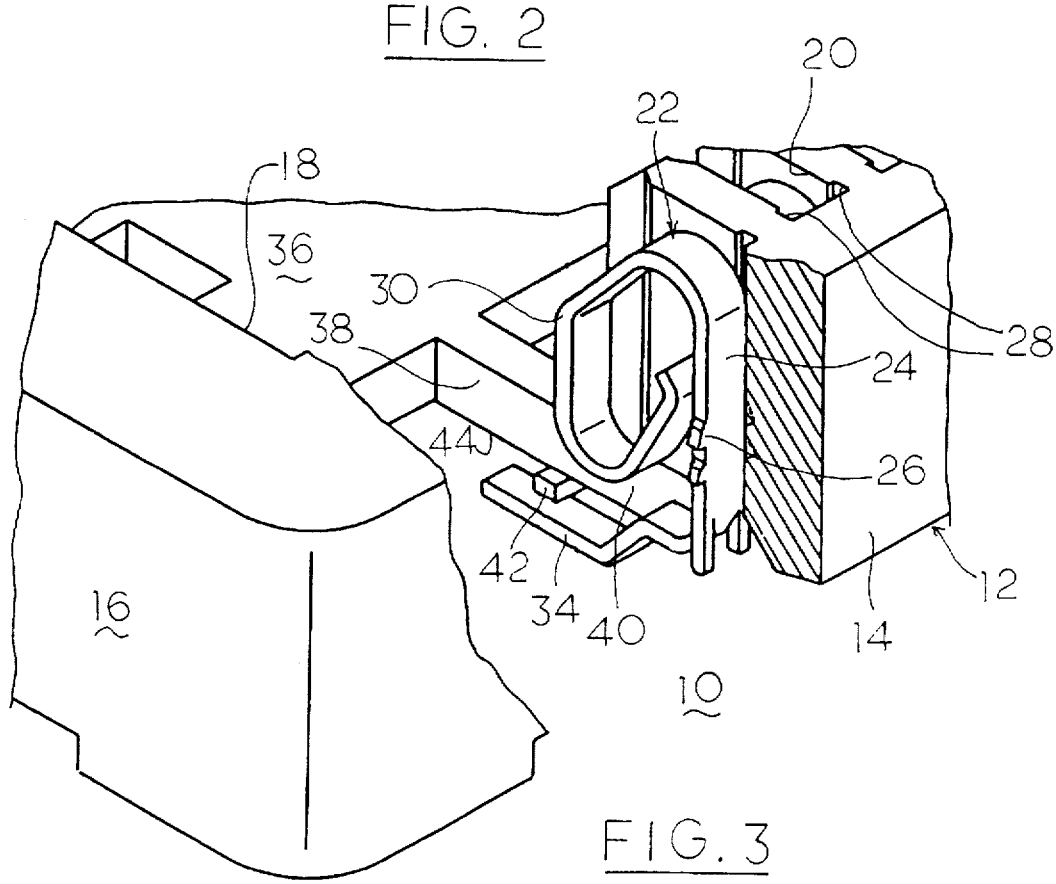
FIG. 3 is an enlarged fragmentary perspective view of the socket connector of FIG. 1.

It will be noted here that for a better understanding, most of like components are designated by like reference numerals throughout the various figures in the embodiments. Attention is directed to FIGS. 1–3 wherein a socket connector 10 includes an insulative housing 12 consisting of a pair of side walls 14 and a pair of end walls 16 commonly defining a cavity 18 therein for receiving a chip carrier (not shown) therein.

Two rows of passageways 20 are respectively disposed in two side walls 16 facing to and communicating with the cavity 18 wherein each passageway 20 is adapted to receive a contact 22 therein. Each contact 22 includes a main body 24 having barbs 26 on two sides for interferential engagement within a pair of retention slots 28 by two sides of the corresponding passageway 20. From the main body 24, an engagement section 30 extends upward from the main body 24 for engagement with the corresponding lead of the chip carrier (not shown), and a contact tail 34 extends downward and successively horizontally.

A bottom plate 36 is provided with the housing 12 and under the cavity 18. A plurality of openings 38 are provided in the bottom plate 36 close to the passageways 20 wherein each opening 38 corresponds to every two adjacent passageways 20. Certainly, a dividing bar 40 is formed between every two adjacent openings 38. A pair of shortened abutment wings 42 extend laterally respectively on two sides of each dividing bar 40 on the under-surface 44 of the bottom plate 36 whereby the contact tails 34 of two adjacent contacts 22 by two sides of each dividing bar 40 can engageably abut against the corresponding abutment wings 42, respectively, so that all the contact tails 34 of the contacts 22 can be aligned in a same plane.

It can be contemplated that for each opening 38, the wing 42 on one side of one dividing bar 40 is substantially spaced and separated from another opposing wing 42 on the opposite side of another adjacent dividing bar 40 in a distance so that such corresponding opening 38 will not be interrupted by such two wings 42. Thus, the invention not only provides good mechanism for aligning the contact tails 34, but also allows easy access and inspection of the contact tails 34 as pursued in the prior arts.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A socket connector, comprising:

an insulative housing including of a pair of elongated side walls and a pair of end walls commonly defining a cavity for receiving a chip carrier therein;

two rows of passageways disposed in two side walls for receiving a corresponding number of contacts therein;

each of said contacts including a main body with retention means thereon, an engaging section upward extending from the main body, and a tail section downwardly and successively horizontally extending from the main body;

a bottom plate provided with the housing under the cavity;

a plurality of openings provided in the bottom plate and defining a plurality of dividing bars between every two openings, a pair of abutment wings horizontally laterally extending from two sides of each of dividing bars for engageably aligning the tail sections of the corresponding contacts, wherein each opening corresponds to every two adjacent passageways.

2. A socket connector, comprising:

an insulative housing including a pair of elongated side walls and a pair of end walls commonly defining a cavity for receiving a chip carrier therein;

two rows of passageways disposed in each side wall for receiving a corresponding number of contacts therein;

each of said contacts including a main body with retention means thereon, an engaging section extending upward from the main body, and a tail section downwardly and successively extending horizontally from the main body;

a bottom plate provided with the housing under the cavity;

a plurality of openings provided in the bottom plate and defining a plurality of dividing bars between every two openings, a pair of abutment wings horizontally and laterally extending from two sides of each of the dividing, bars for engagably aligning the tail sections of the corresponding contacts, wherein for each opening, the abutment wing on one side of one dividing bar is spaced from another opposing abutment wing on an opposing side of another adjacent dividing bar so that the corresponding opening will not be obstructed by said two abutment wings.

* * * * *